US012626111B2

(12) United States Patent
Ambrogio et al.

(10) Patent No.: US 12,626,111 B2
(45) Date of Patent: May 12, 2026

(54) CALIBRATING PERIPHERAL VARIABILITY

(71) Applicant: International Business Machines Corporation, Armonk, NY (US)

(72) Inventors: Stefano Ambrogio, San Jose, CA (US); Geoffrey Burr, Cupertino, CA (US); Charles Mackin, San Jose, CA (US); Pritish Narayanan, San Jose, CA (US); HsinYu Tsai, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 1112 days.

(21) Appl. No.: 17/350,162

(22) Filed: Jun. 17, 2021

(65) Prior Publication Data

US 2022/0405554 A1 Dec. 22, 2022

(51) Int. Cl.
| | |
|---|---|
| *G06F 11/30* | (2006.01) |
| *G06N 3/063* | (2023.01) |
| *H05K 1/00* | (2006.01) |

(52) U.S. Cl.
CPC .............. *G06N 3/063* (2013.01); *H05K 1/00* (2013.01)

(58) Field of Classification Search
CPC ..................................................... G06N 3/063
See application file for complete search history.

(56) References Cited

U.S. PATENT DOCUMENTS

| | | | |
|---|---|---|---|
| 10,127,494 B1 | 11/2018 | Cantin | |
| 2019/0156194 A1* | 5/2019 | Burr ........................ | G06N 20/00 |

FOREIGN PATENT DOCUMENTS

| | | | |
|---|---|---|---|
| CN | 112101539 | * | 12/2020 |
| CN | 112101539 A | | 12/2020 |

OTHER PUBLICATIONS

Macking et al., "Weight programming in DNN Analog Hardware Accelerations in the Presence of NVM Variability", Advanced Electronic Materials 5.9, 1900026, 2019, 12 Pages (Year: 2019).*
Mackin et al., "Weight Programming in DNN Analog Hardware Accelerators in the Presence of NVM Variability", Advanced Electronic Materials 5.9, 1900026, 2019, 12 Pages.

* cited by examiner

*Primary Examiner* — Phuong Huynh
(74) *Attorney, Agent, or Firm* — Aaron N. Pontikos

(57) ABSTRACT

Embodiments herein disclose computer-implemented methods, computer program products and computer systems for balancing neural network weight asymmetries. The computer-implemented method may include providing a neural network with weights comprising one or more major conductance pairs and one or more minor conductance pairs. The method may further include programming the one or more major conductance pairs to force an inference output to an expected duration value, determining a positive weight coefficient based on the one or more major conductance pairs and a negative weight coefficient based on the one or more minor conductance pairs, determining one or more target weights based on one or more of the positive weight coefficient and the negative weight coefficient, programming the one or more minor conductance pairs to force the inference output to the expected duration value, and programming the one or more major conductance pairs with the one or more target weights.

20 Claims, 8 Drawing Sheets

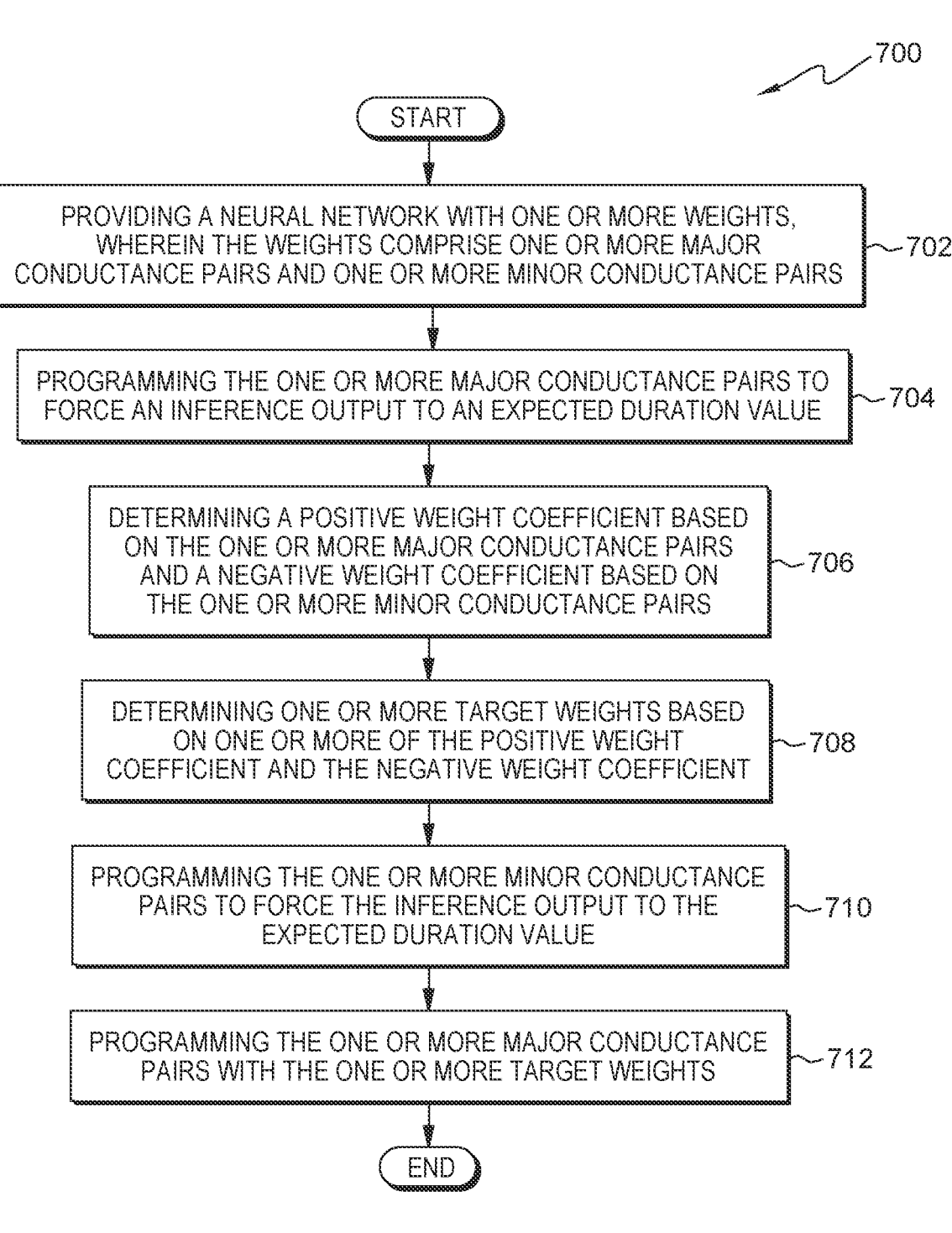

700

START

PROVIDING A NEURAL NETWORK WITH ONE OR MORE WEIGHTS, WHEREIN THE WEIGHTS COMPRISE ONE OR MORE MAJOR CONDUCTANCE PAIRS AND ONE OR MORE MINOR CONDUCTANCE PAIRS    ~702

PROGRAMMING THE ONE OR MORE MAJOR CONDUCTANCE PAIRS TO FORCE AN INFERENCE OUTPUT TO AN EXPECTED DURATION VALUE    ~704

DETERMINING A POSITIVE WEIGHT COEFFICIENT BASED ON THE ONE OR MORE MAJOR CONDUCTANCE PAIRS AND A NEGATIVE WEIGHT COEFFICIENT BASED ON THE ONE OR MORE MINOR CONDUCTANCE PAIRS    ~706

DETERMINING ONE OR MORE TARGET WEIGHTS BASED ON ONE OR MORE OF THE POSITIVE WEIGHT COEFFICIENT AND THE NEGATIVE WEIGHT COEFFICIENT    ~708

PROGRAMMING THE ONE OR MORE MINOR CONDUCTANCE PAIRS TO FORCE THE INFERENCE OUTPUT TO THE EXPECTED DURATION VALUE    ~710

PROGRAMMING THE ONE OR MORE MAJOR CONDUCTANCE PAIRS WITH THE ONE OR MORE TARGET WEIGHTS    ~712

END

FIG. 7

CALIBRATING PERIPHERAL VARIABILITY

BACKGROUND

The present invention relates generally to the field of neural networks, and more particularly to balancing neural network weight asymmetries.

Neural Networks (NNs) can be encoded in hardware chips that perform NN inference at high and low power. Such inference chips leverage Non-Volatile Memories (NVMs), such as Phase Change Material (PCM), and Resistive Memory (RRAM)) to encode weights in a NN. In certain designs, multiple devices are assigned to each weight, with a variable distribution of the programmed weight W (i.e., W=G+−G−+(g+−g−)/F) over various devices, where each G represents the conductance of each device and F is a scaling factor. However, Complementary Metal Oxide Semiconductor (CMOS) hardware periphery is significantly affected by variability, leading to a degraded evaluation of the $\Sigma Wx$ Multiply-Accumulate operation.

There are some methodologies to calibrate CMOS peripheral variability, for example ADC column-to-column variation, but such calibration cannot eliminate all sources of variability, such as current mirror mismatch.

SUMMARY

The present invention is described in various embodiments disclosing computer-implemented methods, computer program products, and computer systems for balancing neural network weight asymmetries.

One embodiment of the present disclosure is a computer-implemented method for balancing neural network weight asymmetries comprising one or more processors configured for providing a neural network with one or more weights, wherein the weights comprise one or more major conductance pairs and one or more minor conductance pairs; programming the one or more major conductance pairs to force an inference output to an expected duration value; determining a positive weight coefficient based on the one or more major conductance pairs and a negative weight coefficient based on the one or more minor conductance pairs; determining one or more target weights based on one or more of the positive weight coefficient and the negative weight coefficient; programming the one or more minor conductance pairs to force the inference output to the expected duration value; and programming the one or more major conductance pairs with the one or more target weights.

In an embodiment, the one or more major conductance pairs are phase change material (PCM) conductances corresponding to a major positive conductance G+ and a major negative conductance G− and the minor conductance pairs are PCM conductances corresponding to a minor positive conductance g+ and a minor negative conductance g−.

The computer-implemented method may further include prior to programming the one or more major conductance pairs, resetting the one or more major conductance pairs; and prior to programming the one or more minor conductance pairs, resetting the one or more major conductance pairs.

In an embodiment, the one or more weights may include positive columns for a positive weight branch having the major positive conductance G+ and the minor positive conductance g+ and negative columns for a negative weight branch having the major negative conductance G− and the minor negative conductance g−.

In an embodiment, the computer-implemented method may further include extracting the positive weight coefficient as a sum of conductances in the positive columns for the positive weight branch; and extracting the negative weight coefficient as a sum of conductances in the negative columns for the negative weight branch.

In an embodiment, programming the one or more major conductance pairs and the one or more minor conductance pairs may further include applying a voltage input comprising a constant amplitude and increasing pulse widths to the one or more weights, wherein the increasing pulse widths increase by a predetermined amount from a first weight of the one or more weights to a last weight of the one or more weights.

In an embodiment, the inference output is forced to the expected duration value when a sum of currents between the one or more major conductance pairs or the one or more minor conductance pairs is 0.

In an embodiment, the computer-implemented method may further include determining mismatch values between the positive columns and the negative columns to identify fixed peripheral asymmetries. Further, the computer-implemented method may apply the mismatch values to the one or more major conductance pairs to counteract the fixed peripheral asymmetries.

In an embodiment, the computer-implemented method may further include incrementally programming the one or more minor conductance pairs to correct write errors incurred during the programming the one or more major conductance pairs with the one or more target weights.

BRIEF DESCRIPTION OF THE DRAWINGS

FIG. 7 depicts a flow chart of steps of a computer-implemented method for balancing neural network weight asymmetries, in accordance with an embodiment of the present invention.

DETAILED DESCRIPTION

Figure 1:
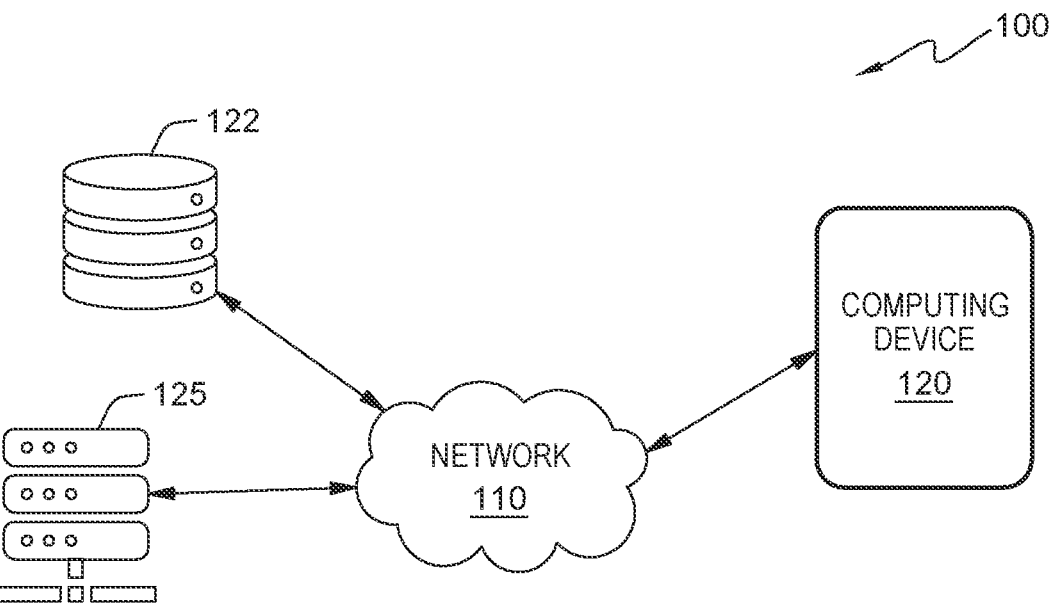
FIG. 1 depicts a block diagram of a distributed data processing environment for balancing neural network weight asymmetries, in accordance with an embodiment of the present invention.

A method is needed to evaluate and counteract fixed asymmetries that exist in NN inference chips to increase the resilience to CMOS peripheral variability. Embodiments of the present invention recognize the need to evaluate and counteract fixed asymmetries that exist in NN inference chips to increase the resilience to CMOS peripheral variability. Embodiments of the present invention address the problem of column-to-column CMOS peripheral array variability for in-memory computing and compensating for such variability through NVM device weight programming.

Embodiments of the present invention provide a system and computer-implemented method for programming weights in neural inference chips affected by intra- and inter-column variability using a periphery mismatch evaluation procedure for intra- and inter-column asymmetries in in-memory computing. The computer-implemented method may include one or more processors configured for programming G+ and G− conductances using closed-loop tuning to obtain the condition that forces neural network inference output to an expected calibration duration value. Further, the computer-implemented method may include one or more processors configured for computing a column-offset factor or weight coefficient to quantitatively evaluate the mismatch between different columns and between positive and negative branches in one column. Further, the g+ and g− conductance pairs or conductance devices compensate for zero-point offset in the column periphery circuitry during weight programming. Further, the column-offset factor may be used to determine new weight targets or new target weights that compensate the column-to-column variability during weight programming. For example, the mismatch values may be based on a difference between the major positive conductance G+ and the major negative conductance G−.

In an embodiment, intercolumn variability relates to the observed differences in the segmentation results obtained by two different columns, while intracolumn variability relates to the observed differences between two results of segmentation tasks performed by the same column at two different times. Due to the crucial role of segmentation, the reproducibility of the method is fundamentally important.

In an embodiment, the computer-implemented method to evaluate and counteract peripheral variability may include one or more processors configured for evaluating edge mirror variability, calculating new target weights based on the programmed G+ and G− conductances, resetting all conductance devices, correcting offsets by forcing the inference output to the expected duration value using g+ and g−, programming weights on G+ and G−, and making final corrections to the programmed weights by tweaking g+ and g−.

In an embodiment, in evaluating edge mirror variability, the one or more processors may be configured for programming G+ and G− conductances in order to force the inference output to the expected duration value. By programming the G+ and G− conductances to force the inference output to the expected duration value, the neural network realizes a condition where current from the G+ and G− columns cancel each other.

In an embodiment, calculating new target weights may include the one or more processors configured for evaluating the mismatch between the positive and negative branch in each column and the corresponding variability from column to column. Based on such information, the one or more processors may be configured to distort the weights that need to be programmed to counteract the fixed peripheral asymmetries.

In an embodiment, once the new target weights are calculated, the one or more processors may be configured to reset all device conductances and correct the offsets forcing the inference output to the expected duration value using g+ and g−. Further, the one or more processors may be configured to program the new target weights to the G+ and G− conductances and final corrections to the programmed weights may be performed by tweaking g+ and g− conductances.

An advantage of counteracting the fixed peripheral asymmetries is that such counteracting enables the compensation of a vast number of peripheral mismatches. Additionally, such calibration can be performed without adding circuit overhead resources.

The present invention will now be described in detail with reference to the Figures.

FIG. 1 depicts a block diagram of a distributed data processing environment 100 for balancing neural network weight asymmetries, in accordance with an embodiment of the present invention. FIG. 1 provides only an illustration of one embodiment of the present invention and does not imply any limitations with regard to the environments in which different embodiments may be implemented. In the depicted embodiment, distributed data processing environment 100 includes computing device 120, server 125, and database 122, interconnected over network 110. Network 110 operates as a computing network that can be, for example, a local area network (LAN), a wide area network (WAN), or a combination of the two, and can include wired, wireless, or fiber optic connections. In general, network 110 can be any combination of connections and protocols that will support communications between computing device 120, server 125, and database 122. Distributed data processing environment 100 may also include additional servers, computers, sensors, or other devices not shown.

Computing device 120 operates to execute at least a part of a computer program for balancing neural network weight asymmetries. Computing device 120 may be configured to send and/or receive data from network 110. In some embodiments, computing device 120 may be a management server, a web server, or any other electronic device or computing system capable of receiving and sending data. In some embodiments, computing device 120 may be a laptop computer, tablet computer, netbook computer, personal computer (PC), a desktop computer, a smart phone, or any programmable electronic device capable of communicating with database 122, server 125 via network 110. Computing device 120 may include components as described in further detail in FIG. 8.

Database 122 operates as a repository for data flowing to and from network 110. A database is an organized collection of data. Database 122 can be implemented with any type of storage device capable of storing data and configuration files that can be accessed and utilized by computing device 120, such as a database server, a hard disk drive, or a flash memory. In an embodiment, database 122 is accessed by computing device 120 to store data corresponding to balancing neural network weight asymmetries. In another embodiment, database 122 may reside elsewhere within distributed network environment 100 provided database 122 has access to network 110.

Server 125 operates to execute at least a part of a computer program for balancing neural network weight asymmetries. Server 125 can be a standalone computing device, a management server, a web server, or any other electronic device or computing system capable of receiving, sending, and processing data and capable of communicating with computing device 120 via network 110. In other embodiments, server 125 represents a server computing system utilizing multiple computers as a server system, such as a cloud computing environment. In yet other embodiments, server 125 represents a computing system utilizing clustered computers and components (e.g., database server computers, application server computers, etc.) that act as a single pool of seamless resources when accessed within distributed data processing environment 100. Server 125 may include components as described in further detail in FIG. 8.

Figure 2:
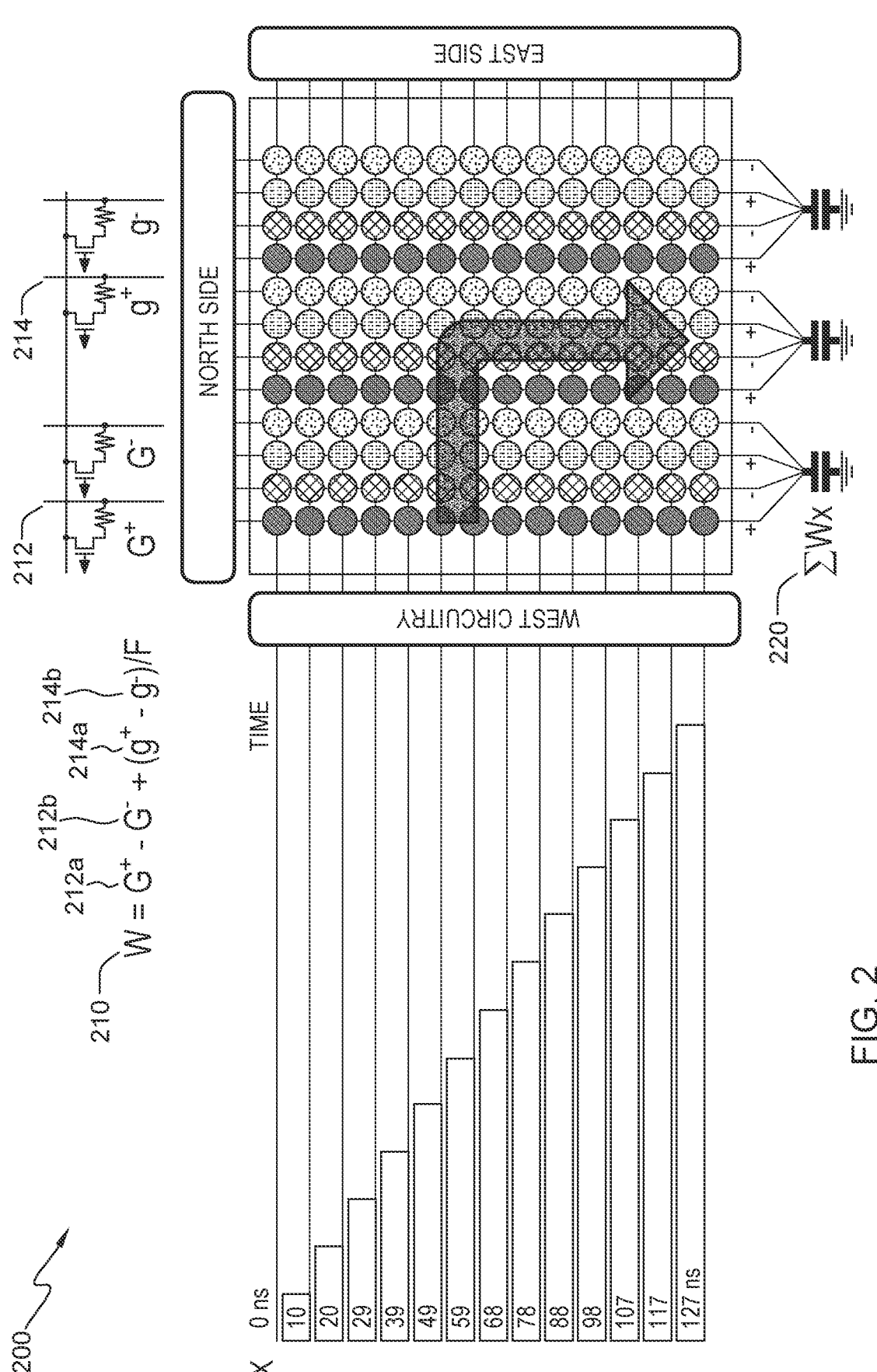
FIG. 2 depicts a neural network for balancing neural network weight asymmetries, in accordance with an embodiment of the present invention.

FIG. 2 depicts a neural network 200 for balancing neural network weight asymmetries, in accordance with an embodiment of the present invention.

In an embodiment, neural network 200 may include one or more processors configured for providing input X to or receiving X input at each branch of the west circuitry, wherein west circuitry conductors connect with north side conductors and form a node as a part of weight 210 that includes major conductance pairs 212 (e.g., major positive conductance G+ 212*a*, major negative conductance G− 212*b*) and minor conductance pairs 214 (e.g., minor positive conductance g+ 214*a*, minor negative conductance g− 214*b*). X input may be encoded using voltage pulses with constant amplitude and variable pulse width. Further, the one or more processors may be configured to perform weight (W) encoding using four (4) devices (e.g., major and minor conductance pairs) as follows: W=G+−G−+(g+−g−)/F, wherein F is a scaling factor. In an embodiment, a weight summation 220 may be determined based on the total conductance values for each of the conductance pairs when input X is applied as described above.

Figure 3:
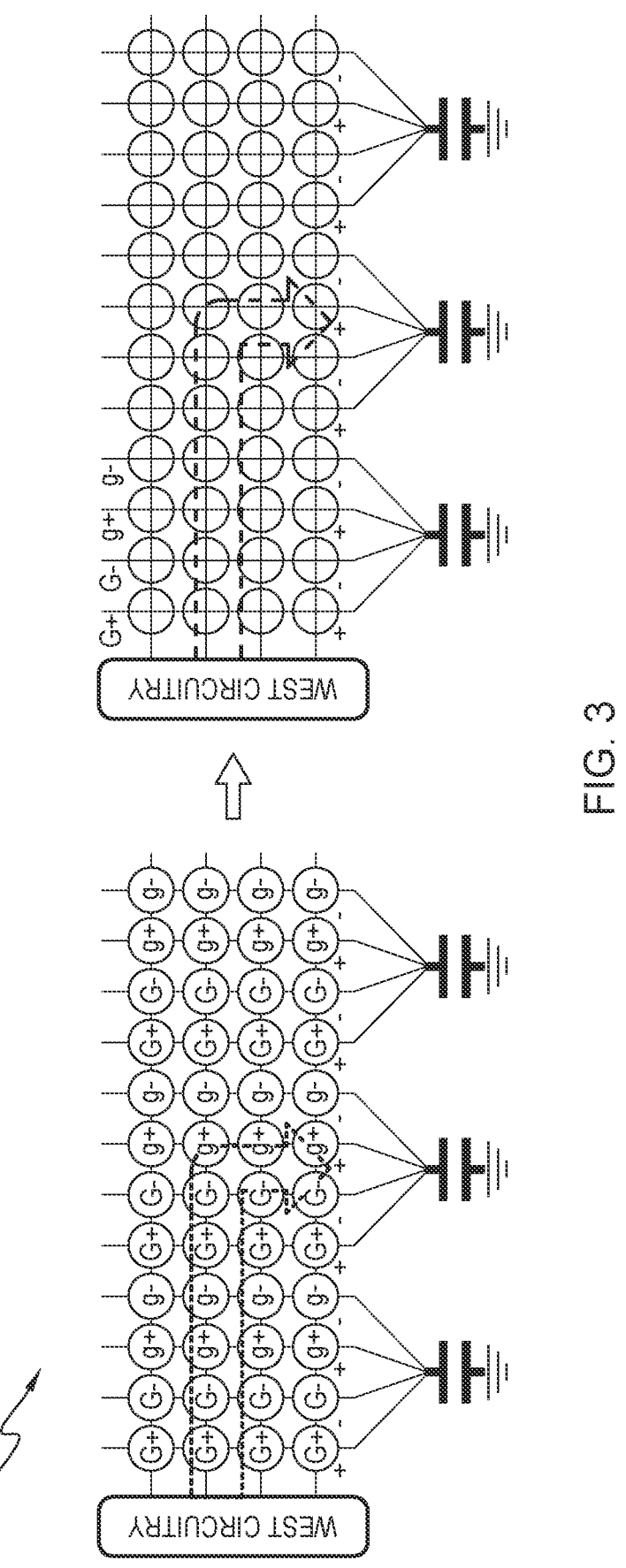
FIG. 3 depicts a neural network reset diagram for balancing neural network weight asymmetries, in accordance with an embodiment of the present invention.

FIG. 3 depicts a neural network reset diagram 300 for balancing neural network weight asymmetries, in accordance with an embodiment of the present invention.

In an embodiment, neural network 200 may include one or more processors configured for resetting one or more of major conductance pairs 212 and minor conductance pairs 214 prior to programming either of major conductance pairs 212 or minor conductance pairs 214. For example, prior to programming major conductance pairs 212, the one or more processors may be configured to reset major conductance pairs 212. Further, prior to programming major conductance pairs 212, the one or more processors may be configured to reset minor conductance pairs 214. By resetting one or more of the conductance pairs, neural network 200 is cleared of any residual or remaining data stored in the conductance pairs to ensure accurate programming.

In an embodiment, the one or more processors may be configured to evaluate edge mirror variability. For example, in an ideal CMOS peripheral circuitry, current contributions from positive (i.e., $W^+=G^++g^+/F$) and negative (i.e., $W^-=G^-+g^-/F$) weight branches should equally balance. However, current mirror mismatch leads to peripheral asymmetry.

Figure 4:
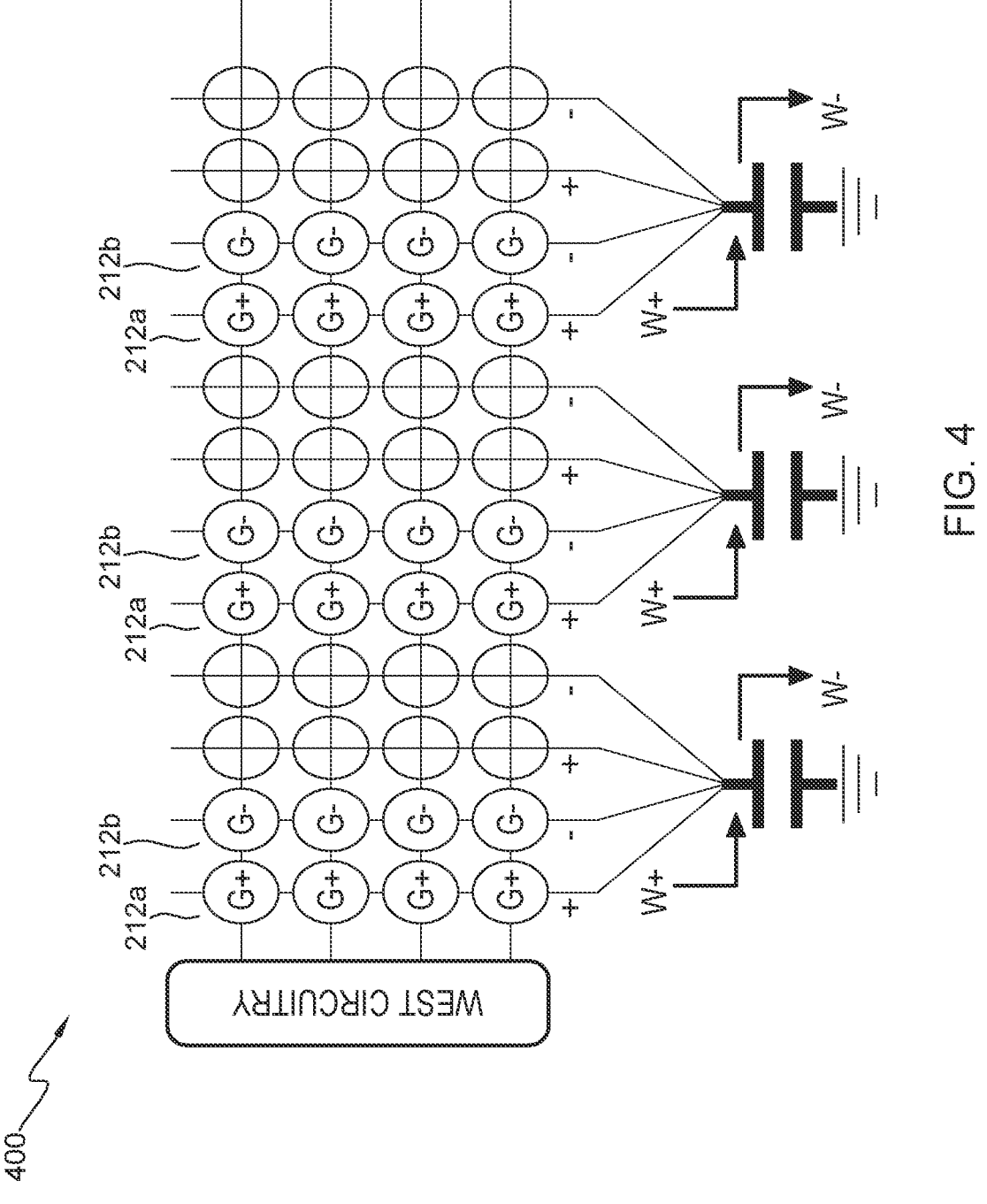
FIG. 4 depicts a neural network major conductance program diagram for balancing neural network weight asymmetries, in accordance with an embodiment of the present invention.

FIG. 4 depicts a neural network major conductance program diagram 400 for balancing neural network weight asymmetries, in accordance with an embodiment of the present invention.

In an embodiment, the one or more processors may be configured to calibrate edge mirror variability of neural network 200. In order to evaluate mismatch, one or more processors may be configured for programming major conductance pairs 212 (e.g., major positive conductance G+ 212*a*, major negative conductance G− 212*b*) to force an inference output to an expected duration value. For example, in one weight column, G+ and G− are programmed to ensure a constant output. Once the output for the weight column is constant, each conductance (e.g., G+ and G−) are read separately and each separate conductance column is summed to obtain a weight value for each column. For example, the summation of the G+ conductance will correspond to W+ and the summation of the G− conductances will correspond to W−. By programming the G+ and G− conductances to force the inference output to the expected duration value, neural network 200 realizes a condition where current from the G+ and G− columns cancel each other. For example, PCM closed-loop programming may be performed to program major conductance pairs 212 with output read using random input noise.

Figure 5:
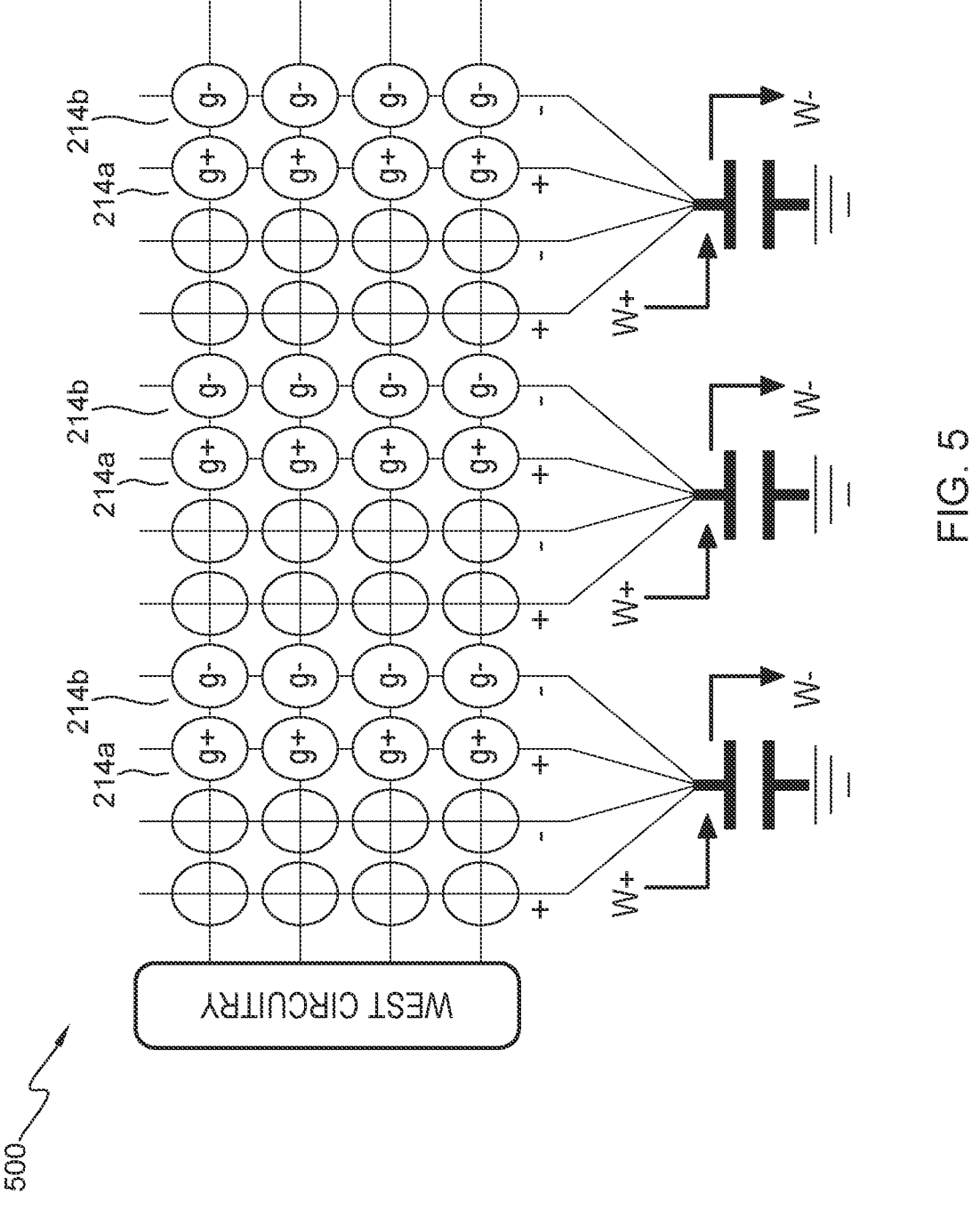
FIG. 5 depicts a neural network minor conductance program diagram for balancing neural network weight asymmetries, in accordance with an embodiment of the present invention.

FIG. 5 depicts a neural network minor conductance program diagram 500 for balancing neural network weight asymmetries, in accordance with an embodiment of the present invention.

In an embodiment, the one or more processors may be configured for determining a positive weight coefficient based on the major conductance pairs 212 and a negative weight coefficient based on the minor conductance pairs 214. For example, the positive weight coefficient may be determined as a sum of conductances in the positive columns for the positive weight branch and the negative weight coefficient may be determined as a sum of conductances in the negative columns for the negative weight branch.

Further, the one or more processors may be configured for determining one or more target weights based on one or more of the positive weight coefficient and the negative weight coefficient, and programming the minor conductance pairs 214 (e.g., minor positive conductance g+ 214*a*, minor negative conductance g−) to force the inference output to the expected duration value. Target weights need to be distorted to compensate for the mismatch. Calculation of new target weights may be based on the programmed major conductance pairs, wherein the mismatch between the positive and negative branches in each column are evaluated and the corresponding variability from column to column are determined. For example, column variability may be determined by calculating the W+ and W− coefficients as described above herein. Once the W+ and W− coefficients are determined, the one or more processors may be configured to quantify the differences between columns and in the same weight column. If all the columns' conductances are exactly the same, then the W+ and W− coefficients between the columns would be the same between the weights and between all columns.

In an embodiment to calculate the new target weights, conductances may be summed over columns and coefficients for W+ and W− are extracted for each output neuron. Once the W+ and W− weights have been determined, target weights are determined to be programmed in each corresponding column. For example, the positive weights are divided by W+ and the negative weights are divided by the W− to generate the target weights.

In an embodiment, the one or more processors may be configured for determining mismatch values between the positive columns and the negative columns to identify fixed peripheral asymmetries. Further, the mismatch values may be applied to the one or more major conductance pairs to counteract the fixed peripheral asymmetries.

Figure 6:
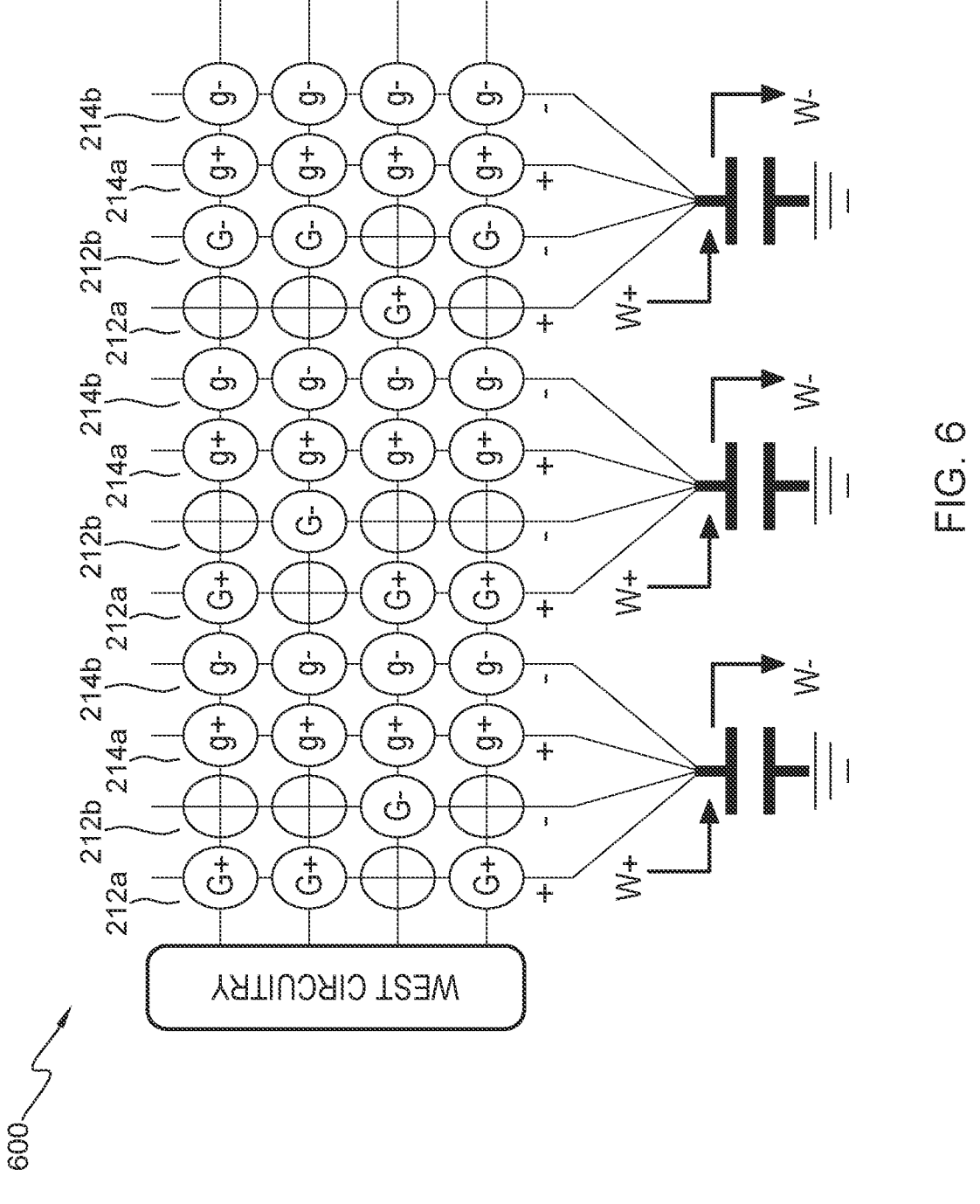
FIG. 6 depicts a neural network target weight program diagram for balancing neural network weight asymmetries, in accordance with an embodiment of the present invention.

FIG. 6 depicts a neural network target weight program diagram 600 for balancing neural network weight asymmetries, in accordance with an embodiment of the present invention.

In an embodiment, the one or more processors may be configured to perform offset compensation and weight programming by resetting major conductance pairs 212, then programming minor conductance pairs 214 to force the inference output to the expected value (exact same procedure for programming major conductance pairs 212), programming major conductance pairs 212 to the target weights that were distorted using single device conductance read (or backdoor read), wherein W+ is programmed to G+ and W− is programmed to G−. Further, a final incremental program may be performed on selected minor conductance pairs to correct write errors during major conductance pairs programming. In other words, final corrections to the programmed weights are performed by tweaking the minor conductance pairs.

In an embodiment, prior to the final incremental program, proper weights may be programmed corresponding to W=(G+−G−)+(g+−g−)/F, as described above herein. However, the weights may be programmed with some error. Therefore, the programmed weight is read, and the one or more processors are configured to evaluate if the programmed weight is smaller or larger than the target weight. If the programmed weight is smaller, then the one or more processors may be configured to increase the programmed weight by increasing one or more of the conductances (e.g., increase g+). If the programmed weight is larger than the target weight, then the one or more processors may be configured to decrease the programmed weight by decreasing one or more of the conductances (e.g., decrease g−).

FIG. 7 depicts a flow chart of steps of a computer-implemented method 700 for balancing neural network weight asymmetries, in accordance with an embodiment of the present invention.

In an embodiment, computer-implemented method 700 may include one or more processors configured for providing 702 a neural network comprising one or more weights comprising one or more major conductance pairs and one or more minor conductance pairs. In an embodiment, the one or more major pair of conductances are phase change material (PCM) conductances corresponding to a major positive conductance G+ and a major negative conductance G− and the minor pair of conductances are PCM conductances corresponding to a minor positive conductance g+ and a minor negative conductance g−. In an embodiment, the one or more weights may include a positive weight branch having the major positive conductance G+ and the minor positive conductance g+ and a negative weight branch having the major negative conductance G− and the minor negative conductance g−.

In an embodiment, computer-implemented method 700 may include one or more processors configured for programming 704 the one or more major conductance pairs to force an inference output to an expected duration value.

In an embodiment, computer-implemented method 700 may include one or more processors configured for determining 706 a positive weight coefficient based on the one or more major conductance pairs and a negative weight coefficient based on the one or more minor conductance pairs.

In an embodiment, computer-implemented method 700 may include one or more processors configured for extracting the positive weight coefficient as a sum of conductances in the positive columns for the positive weight branch; and extracting the negative weight coefficient as a sum of conductances in the negative columns for the negative weight branch.

In an embodiment, computer-implemented method 700 may include one or more processors configured for determining 708 one or more target weights based on one or more of the positive weight coefficient and the negative weight coefficient.

In an embodiment, computer-implemented method 700 may include one or more processors configured for programming 710 the one or more minor conductance pairs to force the inference output to the expected duration value. In an embodiment, the inference output is forced to the expected duration value when a sum of currents between the major pair of conductances is 0.

In an embodiment, computer-implemented method 700 may include one or more processors configured for programming 712 the one or more major conductance pairs with the one or more target weights. In some embodiments, prior to programming the one or more major conductance pairs, computer-implemented method 700 may include one or more processors configured for resetting the major conductance pairs and prior to programming the one or more minor conductance pairs, resetting the major conductance pairs.

In an embodiment, programming the one or more major conductance pairs and the one or more minor conductance pairs may further include one or more processors configured for applying a voltage input comprising a constant amplitude and increasing pulse widths to the one or more weights, wherein the increasing pulse widths increase by a predetermined amount from a first weight of the one or more weights to a last weight of the one or more weights.

In an embodiment, computer-implemented method 700 may further include one or more processors configured for determining mismatch values between the positive columns and the negative columns to identify fixed peripheral asymmetries. Further, computer-implemented method 700 may include one or more processors configured for applying the mismatch values to the one or more major conductance pairs to counteract the fixed peripheral asymmetries.

In an embodiment, computer-implemented method 700 may further include incrementally programming the one or more minor conductance pairs to correct write errors incurred during the programming the one or more major conductance pairs with the one or more target weights. In an embodiment, incrementally programming the minor conductance pairs may be performed after programming the major conductances. For example, weights are initially programmed to compensate for variability by employing the minor pair of conductances, then programming the weights using the major pair of conductances. Further, target weights are distorted to counter-account for circuit positive-negative branch distortions.

Various machine learning techniques may be used to train and operate trained components to perform various processes described herein. Models may be trained and operated according to various machine learning techniques. Such techniques may include, for example, neural networks (such as deep neural networks and/or recurrent neural networks), inference engines, trained classifiers, etc. Examples of trained classifiers include Support Vector Machines (SVMs), neural networks, decision trees, AdaBoost (short for "Adaptive Boosting") combined with decision trees, and random forests. Focusing on SVM as an example, SVM is a supervised learning model with associated learning algorithms that analyze data and recognize patterns in the data, and which are commonly used for classification and regression analysis. Given a set of training examples, each marked as belonging to one of two categories, an SVM training algorithm builds a model that assigns new examples into one category or the other, making it a non-probabilistic binary linear classifier. More complex SVM models may be built with the training set identifying more than two categories, with the SVM determining which category is most similar to input data. An SVM model may be mapped so that the examples of the separate categories are divided by clear gaps. New examples are then mapped into that same space and predicted to belong to a category based on which side of the gaps they fall on. Classifiers may issue a "score" indicating which category the data most closely matches. The score may provide an indication of how closely the data matches the category.

In order to apply the machine learning techniques, the machine learning processes themselves need to be trained. Training a machine learning component requires establishing a "ground truth" for the training examples. In machine learning, the term "ground truth" refers to the accuracy of a training set's classification for supervised learning techniques. Various techniques may be used to train the models including backpropagation, statistical learning, supervised learning, semi-supervised learning, stochastic learning, or other known techniques.

Figure 8:
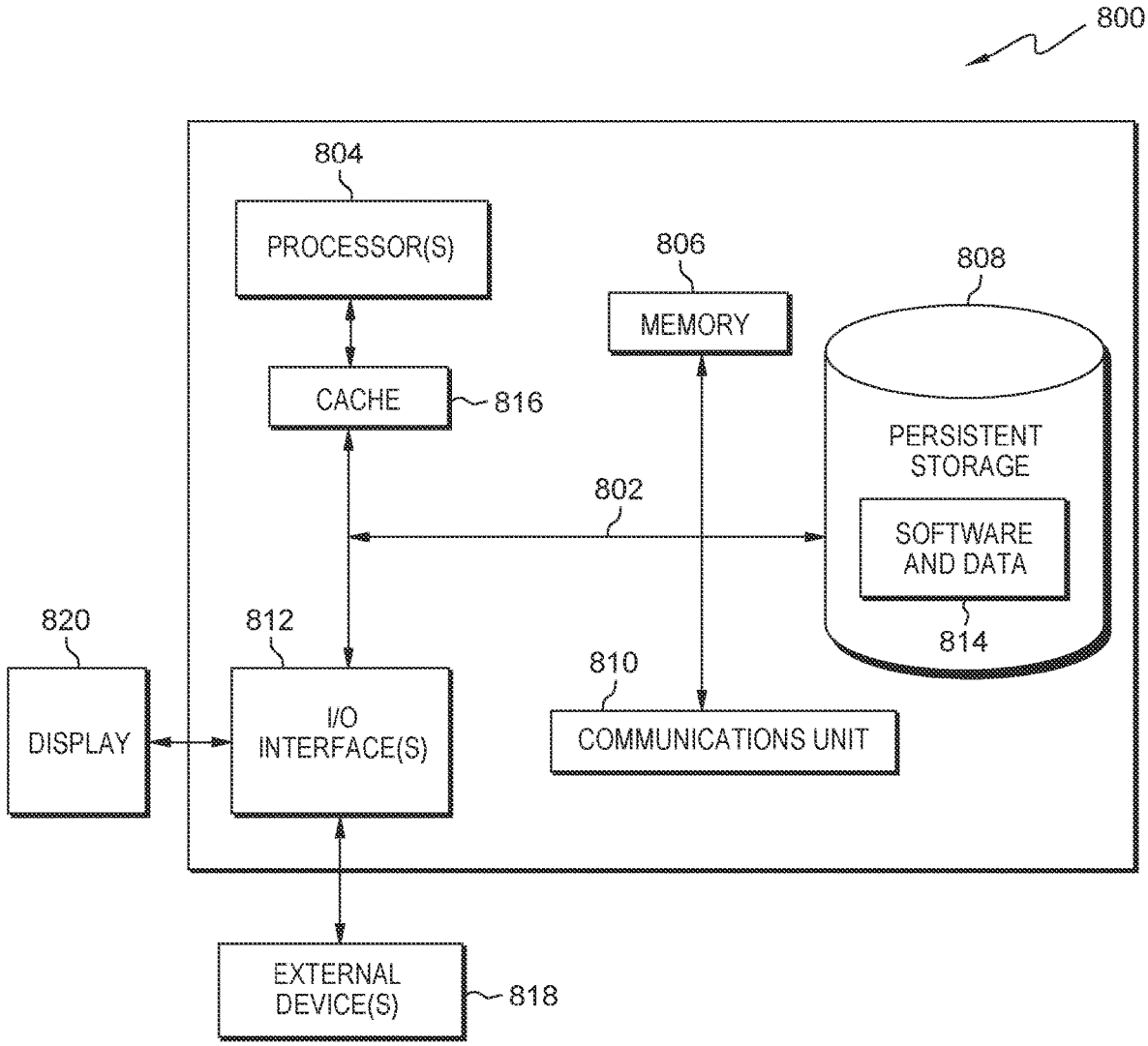
FIG. 8 depicts a block diagram of a computing device of the distributed data processing environment of FIG. 1, in accordance with an embodiment of the present invention.

FIG. 8 depicts a block diagram of a computing device 800 of distributed computing environment 100, in accordance with an embodiment of the present invention. FIG. 8 depicts a block diagram of computing device 800 suitable for server 125 and computing device 120, in accordance with an illustrative embodiment of the present invention. It should be appreciated that FIG. 8 provides only an illustration of one implementation and does not imply any limitations with regard to the environments in which different embodiments may be implemented. Many modifications to the depicted environment may be made.

Computing device 800 includes communications fabric 802, which provides communications between cache 816, memory 806, persistent storage 808, communications unit 810, and input/output (I/O) interface(s) 812. Communications fabric 802 can be implemented with any architecture designed for passing data and/or control information between processors (such as microprocessors, communications and network processors, etc.), system memory, peripheral devices, and any other hardware components within a system. For example, communications fabric 802 can be implemented with one or more buses or a crossbar switch.

Memory 806 and persistent storage 808 are computer readable storage media. In this embodiment, memory 806 includes random access memory (RAM). In general, memory 806 can include any suitable volatile or non-volatile computer readable storage media. Cache 816 is a fast memory that enhances the performance of computer processor(s) 804 by holding recently accessed data, and data near accessed data, from memory 806.

Programs may be stored in persistent storage 808 and in memory 806 for execution and/or access by one or more of the respective computer processors 804 via cache 816. In an embodiment, persistent storage 808 includes a magnetic hard disk drive. Alternatively, or in addition to a magnetic hard disk drive, persistent storage 808 can include a solid-state hard drive, a semiconductor storage device, read-only memory (ROM), erasable programmable read-only memory (EPROM), flash memory, or any other computer readable storage media that is capable of storing program instructions or digital information.

The media used by persistent storage 808 may also be removable. For example, a removable hard drive may be used for persistent storage 808. Other examples include optical and magnetic disks, thumb drives, and smart cards that are inserted into a drive for transfer onto another computer readable storage medium that is also part of persistent storage 808.

Communications unit 810, in these examples, provides for communications with other data processing systems or devices. In these examples, communications unit 810 includes one or more network interface cards. Communications unit 810 may provide communications through the use of either or both physical and wireless communications links. Programs, as described herein, may be downloaded to persistent storage 808 through communications unit 810.

I/O interface(s) 812 allows for input and output of data with other devices that may be connected to computing device 120. For example, I/O interface 812 may provide a connection to external devices 818 such as a keyboard, a keypad, a touch screen, and/or some other suitable input device. External devices 818 can also include portable computer readable storage media such as, for example, thumb drives, portable optical or magnetic disks, and memory cards. Software and data 814 used to practice embodiments of the present invention can be stored on such portable computer readable storage media and can be loaded onto persistent storage 808 via I/O interface(s) 812. I/O interface(s) 812 also connect to a display 820.

Display 820 provides a mechanism to display data to a user and may be, for example, a computer monitor.

Software and data 814 described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a computer-implemented method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method for balancing neural network weight asymmetries, comprising:

evaluating, by one or more processors, edge mirror variability of complementary metal oxide semicondutor (CMOS) circuitry located peripheral to a memory array, wherein evaluating the edge mirror variability of the CMOS circuitry includes:

resetting, by the one or more processors, a conductance of each memory device of one or more major conductance pairs of memory devices and one or more minor conductance pairs of memory devices included in the memory array;

programming, by one or more processors, the conductance of each memory device of the one or more major conductance pairs of memory devices to force an inference output to an expected duration value; and determining, by the one or more processors, based on the programed conductances of the one more major conductance pairs of memory devices, a current mirror mismatch between positive and negative weight branches of the memory array;

determining, by the one or more processors, one or more target weights to compensate for the current mirror mismatch between the positive and negative weight branches of the memory array; and programming, by the one or more processors, the conductance of one or more memory devices of the one or more major conductance pairs of memory devices to the one or more target weights.

2. The computer-implemented method of claim 1, wherein the one or more major conductance pairs of memory devices are phase change material (PCM) conductances corresponding to a major positive conductance G+ and a major negative conductance G− and the one or more minor conductance pairs of memory devices are PCM conductances corresponding to a minor positive conductance g+ and a minor negative conductance g−.

3. The computer-implemented method of claim 1, further comprising:

prior to programming the conductance of the one or more memory devices of the one or more major conductance pairs of memory devices to the one or more target weights:

resetting, by the one or more processors, the conductance of each memory device of the one or more major conductance pairs of memory devices; and programming, by the one or more processors, the conductance of each memory device of the one or more minor conductance pairs of memory devices to force the inference output to the expected duration value.

4. The computer-implemented method of claim 2, further comprising providing one or more weights to a neural network, wherein the one or more weights comprise positive columns of memory devices in the memory array for a positive weight branch having the major positive conductance G+ and the minor positive conductance g+ and negative columns of memory devices in the memory array for a negative weight branch having the major negative conductance G− and the minor negative conductance g−.

5. The computer-implemented method of claim 4, further comprising:

extracting, by the one or more processors, a positive weight coefficient as a sum of conductances in the positive columns for the positive weight branch; and extracting, by the one or more processors, a negative weight coefficient as a sum of conductances in the negative columns for the negative weight branch, wherein the one or more target weights are further based on one or more of the positive weight coefficient and the negative weight coefficient.

6. The computer-implemented method of claim 1, wherein programming the conductance of each memory device of the one or more major conductance pairs of memory devices and programming the conductance of each memory device of the one or more minor conductance pairs of memory devices further comprise:

applying, by the one or more processors, a voltage input comprising a constant amplitude and increasing pulse widths to one or more weights, wherein each weight is formed from a major conductance pair of memory devices and a minor conductance pair of memory devices, and wherein the increasing pulse widths increase by a predetermined amount from a first weight of the one or more weights to a last weight of the one or more weights.

7. The computer-implemented method of claim 1, wherein the inference output is forced to the expected duration value when a sum of currents between the one or more major conductance pairs of memory devices or the one or more minor conductance pairs of memory devices is 0.

8. The computer-implemented method of claim 3, further comprising:

incrementally programming, by the one or more processors, the one or more minor conductance pairs of memory devices to correct write errors incurred during the programming of the conductance of the one or more memory devices of the one or more major conductance pairs of memory devices to the one or more target weights.

9. A computer program product for balancing neural network weight asymmetries, the computer program product comprising:

one or more computer readable storage media and program instructions stored on the one or more computer readable storage media, the program instructions comprising:

program instructions to evaluate edge mirror variability of complementary metal oxide semicondutor (CMOS) circuitry located peripheral to a memory array, wherein the program instructions to evaluate the edge mirror variability of the CMOS circuitry include instructions to:

reset a conductance of each memory device of one or more major conductance pairs of memory devices and one or more minor conductance pairs of memory devices included in the memory array;

program instructions to program the conductance of each memory device of one or more major conductance pairs of memory devices to force an inference output to an expected duration value; and program instructions to determine, based on the programed conductances of the one more major conductance pairs of memory devices, a current mirror mismatch between positive and negative weight branches of the memory array;

program instructions to determine one or more target weights to compensate for the current mirror mismatch between the positive and negative weight branches of the memory array; and program instructions to program the conductance of one or more memory devices of the one or more major conductance pairs of memory devices to the one or more target weights.

10. The computer program product of claim 9, wherein the one or more major conductance pairs of memory devices are phase change material (PCM) conductances corresponding to a major positive conductance G+ and a major negative conductance G− and the one or more minor conductance pairs of memory devices are PCM conductances corresponding to a minor positive conductance g+ and a minor negative conductance g−.

11. The computer program product of claim 9, further comprising:

prior to the program instructions to program the conductance of the one or more memory devices of the one or more major conductance pairs of memory devices to the one or more target weights:

program instructions to reset the conductance of each memory device of the one or more major conductance pairs of memory devices; and program instructions to program the conductance of each memory device of the one or more minor conductance pairs of memory devices to force the inference output to the expected duration value.

12. The computer program product of claim 10, further comprising program instructions to provide one or more weights to a neural network, wherein the one or more weights comprise positive columns of memory devices in the memory array for a positive weight branch having the major positive conductance G+ and the minor positive conductance g+ and negative columns of memory devices in the memory array for a negative weight branch having the major negative conductance G− and the minor negative conductance g−.

13. The computer program product of claim 12, further comprising:

program instructions to extract a positive weight coefficient as a sum of conductances in the positive columns for the positive weight branch; and program instructions to extract a negative weight coefficient as a sum of conductances in the negative columns for the negative weight branch, wherein the one or more target weights are further based on one or more of the positive weight coefficient and the negative weight coefficient.

14. The computer program product of claim 9, wherein the program instructions to program the conductance of each memory device of the one or more major conductance pairs memory devices and program the conductance of each memory device of the one or more minor conductance pairs of memory devices further comprise:

program instructions to apply a voltage input comprising a constant amplitude and increasing pulse to one or more weights, wherein each weight is formed from a major conductance pair of memory devices and a minor conductance pair of memory devices, and wherein the increasing pulse widths increase by a predetermined amount from a first weight of the one or more weights to a last weight of the one or more weights.

15. The computer program product of claim 9, wherein the inference output is forced to the expected duration value when a sum of currents between the one or more major conductance pairs of memory devices or the one or more minor conductance pairs of memory devices is 0.

16. The computer program product of claim 11, further comprising:

program instructions to incrementally program the one or more minor conductance pairs of memory devices to correct write errors incurred during the programming of the conductance of the one or more memory devices of the one or more major conductance pairs of memory devices to the one or more target weights.

17. A computer system for balancing neural network weight asymmetries, the computer system comprising:

one or more computer processors;

one or more computer readable storage media;

program instructions stored on the one or more computer readable storage media for execution by at least one of the one or more processors, the program instructions comprising:

program instructions to evaluate edge mirror variability of complementary metal oxide semicondutor (CMOS) circuitry located peripheral to a memory array, wherein the program instructions to evaluate the edge mirror variability of the CMOS circuitry include instructions to:

reset a conductance of each memory device of one or more major conductance pairs of memory devices and one or more minor conductance pairs of memory devices included in the memory array;

program instructions to program the conductance of each memory device of one or more major conductance pairs of memory devices to force an inference output to an expected duration value; and program instructions to determine, based on the programed conductances of the one more major conductance pairs of memory devices, a current mirror mismatch between positive and negative weight branches of the memory array;

program instructions to determine one or more target weights to compensate for the current mirror mismatch between the positive and negative weight branches of the memory array; and program instructions to program the conductance of one or more memory devices of the one or more major conductance pairs of memory devices to the one or more target weights.

18. The computer system of claim 17, wherein the one or more major conductance pairs of memory devices are phase change material (PCM) conductances corresponding to a major positive conductance G+ and a major negative conductance G− and the one or more minor conductance pairs of memory devices are PCM conductances corresponding to a minor positive conductance g+ and a minor negative conductance g−.

19. The computer system of claim 17, further comprising:

prior to the program instructions to program the conductance of the one or more memory devices of the one or more major conductance pairs of memory devices to the one or more target weights:

program instructions to reset the conductance of each memory device of the one or more major conductance pairs of memory devices; and program instructions to program the conductance of each memory device of the one or more minor conductance pairs of memory devices to force the inference output to the expected duration value.

20. The computer system of claim 18, further comprising:

program instructions to extract a positive weight coefficient as a sum of conductances in the positive columns for the positive weight branch; and program instructions to extract a negative weight coefficient as a sum of conductances in the negative columns for the negative weight branch, wherein the one or more target weights are further based on one or more of the positive weight coefficient and the negative weight coefficient.

* * * * *